US008554525B2

(12) United States Patent
Young, Jr. et al.

(10) Patent No.: US 8,554,525 B2
(45) Date of Patent: Oct. 8, 2013

(54) MODELING COMPLEX ENVIRONMENTS USING AN INTERCONNECTED SYSTEM OF SIMULATION LAYERS

(75) Inventors: Robert L. Young, Jr., Encinitas, CA (US); Raph Koster, San Diego, CA (US); Stone Perales, Aliso Viejo, CA (US); Alexander Raine, Carlsbad, CA (US)

(73) Assignee: Sony Online Entertainment LLC, San Diego, CA (US)

(*) Notice: Subject to any disclaimer, the term of this patent is extended or adjusted under 35 U.S.C. 154(b) by 1702 days.

(21) Appl. No.: 11/410,219

(22) Filed: Apr. 24, 2006

(65) Prior Publication Data

US 2007/0124125 A1    May 31, 2007

Related U.S. Application Data

(60) Provisional application No. 60/741,512, filed on Nov. 30, 2005.

(51) Int. Cl.
*G06G 7/48* (2006.01)

(52) U.S. Cl.
USPC .......................................... 703/6

(58) Field of Classification Search
USPC .............................. 703/6; 715/848
See application file for complete search history.

(56) References Cited

U.S. PATENT DOCUMENTS

2004/0017385 A1* 1/2004 Cosman et al. .............. 345/629

FOREIGN PATENT DOCUMENTS

WO  WO 2005/119598  12/2005
WO  WO 2005/119643  12/2005

OTHER PUBLICATIONS

M.N. Setas et al., "Dynamic Simulation of Natural Environments in Virtual Reality", 1995, Workshop on Simulation and Interaction in Virtual Environments, pp. 1-10.*
Beatrice Ng et al., "A Multi-Server Architecture for Distributed Virtual Walkthrough", 2002, ACM VRST, pp. 163-170.*
Patrick Doyle, "Virtual Intelligence from Artificial Reality: Building Stupid Agents in Smart Environments", 1999, AAAI Technical Report SS-99-02, pp. 1-5.*
Alexandre Mamedov et al., "A computer tool to develop individual-based models for simulation of population interactions", 2002, Elsevier Science B.V., pp. 53-68.*
"Cellular Automaton", http://en.wikipedia.org/wiki/Cellular_Automaton, Wikipedia, 9 pages, encyclopedia entry downloaded Apr. 24, 2006.

* cited by examiner

*Primary Examiner* — Omar Fernandez Rivas
*Assistant Examiner* — Bernard E Cothran
(74) *Attorney, Agent, or Firm* — Mark D. Wieczorek; Mayer & Williams PC

(57) ABSTRACT

A method is provided for creating or evolving a virtual environment with a computer system. Steps of the method include: forming a plurality of layers of data, including a first layer and a second layer, each layer including a plurality of cells containing data corresponding to a variable; operating on the data from the cells in the first layer with a function to yield target data; distributing the target data to corresponding cells in the second layer; and altering the data in at least one of the plurality of cells in each layer according to a rule.

24 Claims, 6 Drawing Sheets

MODELING COMPLEX ENVIRONMENTS USING AN INTERCONNECTED SYSTEM OF SIMULATION LAYERS

STATEMENT OF RELATED APPLICATIONS

This application claims the benefit of U.S. Provisional Patent Application Ser. No. 60/741,512, filed Nov. 30, 2005, entitled "Modeling Complex Computer Behavior Using an Interconnected System of Simulation Layers", which application is incorporated by reference in its entirety herein.

FIELD OF THE INVENTION

The invention relates to systems and methods for modeling complex environments using a computer, and in particular for creating artificial environments that evolve according to predetermined rules.

BACKGROUND OF THE INVENTION

Modern computer games demands increasing amounts of complex content in the form of virtual environments, ecologies, and interconnected systems. As a result, professional game designers and artists are required to spend significant time and expense hand-creating such content, e.g., the artwork, textures, layouts, and procedures that form virtual environments.

After such efforts are expended, the resulting virtual environment, because it has been "hard-coded" into the system, is often static, unchanging, and does not respond greatly to player interaction.

Some attempts at simulating environments have been made by way of cellular automata. However, such attempts are limited at least in part by the rules governing cellular automata.

SUMMARY OF THE INVENTION

A system and method are provided for modeling complex behavior such as virtual environments using a computer. The system and method employ an interconnected system of simulation layers, each running rulesets and pipes that functionally interconnect layers.

The systems and methods allow emergent environment behavior without "hard coding" such behavior into the application. In one implementation, a system models a virtual environment using multiple layers, where each layer includes a grid of cells, each having a set of abstract data stored within. The data in each cell corresponds to the variable the layer is modeling. Each layer is then connected by one or more pipes to other layers. The pipes take data, usually a single value, from a source layer and use the same in a function or calculation, the results of which are delivered into a target layer. In this way, the values in one layer bear a relationship to the values in another, as they would in a realistic environment. Piped data may be applied and used in calculations in at least one and sometimes several layers. Piped data may also be abstracted to allow the value to be reapplied to the same or to different data types.

In this way, a virtual environment, e.g., an ecological system, may be rapidly modeled and may serve as the basis for a graphic rendering engine to simulate complex behaviors such as water flow, grass growth, and cloud formation.

In one aspect, the invention is directed towards a method for creating a virtual environment with a computer system. Steps of the method include: forming a plurality of layers of data, including a first layer and a second layer, each layer including a plurality of cells containing data corresponding to a variable; operating on the data from the cells in the first layer with a function to yield target data; distributing the target data to corresponding cells in the second layer; and altering the data in at least one of the plurality of cells in each layer according to a rule. In another aspect, the invention is directed to a computer-readable medium having computer-executable instructions for performing these steps.

Implementations of the method may include one or more of the following. An emitter or drain may be provided increases or decreases, respectively, the value of data in a cell. The rule for a given cell may use data in cells adjacent to the given cell. The operating step may include multiplying the value of a datum in the cell in the first layer by a scalar and adding the value to the value of the corresponding datum in the cell in the second layer, and inserting the sum into the cell in the second layer. An initial value may be set for each of the cells in each layer, and the initial value may be zero, in which case an emitter may be provided to increase the value of data in at least one cell. A growth pattern may be provided for each layer. At least one of the cells of the plurality may include data corresponding to an external agent, such as an external artificial intelligence agent or a player character. The number of cells in the first layer may be equal to the number of cells in the second layer, and the distributing step may constitute a one-to-one mapping. Alternatively, the number of cells in the first layer may be not equal to the number of cells in the second layer, and in that case the distributing step constitutes a spreading of data from a cell in the first layer to a plurality of cells in the second layer. The data in each cell may include a food value and a population value, and the altering step may include spreading population values to a nearest neighbor cell only if the total population and food in a cell is greater than in the nearest neighbor cell. Moreover, the data in each cell may include a food value and a population value, and the altering step may include spreading population values to each of the nearest neighbor cells. The altering step may occur at a tick rate, where the tick rate of the first layer is not equal to the tick rate of the second layer. The altering step may also include: dividing at least one layer of the plurality into a plurality of overlapping sublayers, where certain cells are duplicated in more than one sublayer; sending the data from each sublayer to separate slave processors along with the rule; receiving the altered data from each sublayer back from the slave processors; and combining the sublayers and discarding duplicate data to create one layer containing altered data.

In another aspect, the invention is directed to a method of evolving a virtual environment with a computer system, the virtual environment having a plurality of layers of data including a first layer and a second layer, each layer including a plurality of cells containing data corresponding to a variable. Steps of the method include; operating on the data from the cells in the first layer with a function to yield target data; distributing the target data to corresponding cells in the second layer; and altering the data in at least one of the plurality of cells in each layer according to a rule. In another aspect, the invention is directed to a computer-readable medium having computer-executable instructions for performing these steps.

Implementations of the method may include one or more of the following. The virtual environment may be a massively multiplayer online game, and the data in at least one cell in at least one layer may be dependent on the actions of at least one player character.

In a further aspect, the invention is directed to a computer-readable medium having computer-executable modules including a layer creation module, for creating at least a first layer and a second layer, the layers each including a plurality of cells, each cell having at least one data value. Another module is a pipe creation module, for creating a pipe that operates on the data from the cells in the first layer with a function to yield target data that is then distributed in the second layer.

In yet a further aspect, the invention is directed to a method of communicating data relating to a virtual environment between a server and a client, the virtual environment having a layer of cells of data corresponding to a variable. Steps of the method include, on the server, altering a datum in a first cell of a layer according to data in cells adjacent to the cell; sending the altered datum to a client; on the client, resolving the altered datum into at least two cells corresponding to the first cell; and displaying the at least two cells.

Implementations of the method may include one or more of the following. The method may further comprise: on the server, altering a datum in a second cell adjacent the first cell; sending the altered datum from the second cell to the client; on the client, resolving the altered datum from the second cell into at least two cells corresponding to the second cell; and displaying the at least two cells corresponding to the second cell, where the values of the data of the at least two cells corresponding to the first cell, and the values of the data of the at least two cells corresponding to the second cell, are determined at least in part by interpolation between the values of the data in the first and second cell.

In yet a further aspect, the invention is directed to a method for creating a virtual environment including external agents with a computer system. Steps of the method include forming at least one layer of data, the layer including a plurality of cells, each cell containing data corresponding to a variable; altering the data in at least one cell of the plurality according to a rule; and altering the data in at least one cell of the plurality according to the external agent.

Implementations of the method may include one or more of the following. An initial value may be set for each of the cells in each layer, and the initial value may be zero, in which case an emitter may be provided to increase the value of data in at least one cell. An artificial barrier may be configured across at least a portion of the layer such that no values can transfer or spread across the artificial barrier.

In yet a further aspect, the invention is directed to a method of evolving a virtual environment with a computer system, the virtual environment incorporating an external agent and having at least one layer of data, the layer including a plurality of cells, each cell containing data corresponding to a variable. Steps of the method including: altering the data in at least one cell of the plurality according to a rule, and altering the data in at least one cell of the plurality according to the external agent.

Implementations of the method may include one or more of the following. The altering the data in at least one cell of the plurality according to the external agent step may include altering the data according to the proximity of the external agent to the cell. The step of altering the data in at least one cell of the plurality according to the external agent may include altering the data according to the value of a variable associated with the external agent. The external agent may be a player character or a non-player character in a multiplayer online game, may be an emitter or a drain. The data may correspond to a food value or a population value. The rule may be an expansion rule.

Advantages of a system according to certain embodiments of the invention may include one or more of the following. Individual objects such as animals, plants, bodies of water, snow drifts, players, paths, etc. are combined in a cohesive model with cross-interaction at a level limited only by the imagination of the model builder. Without assigning special attributes to areas or objects, features and objects acquire characteristics and responses with considerable depth. For example, if plant health and growth reacts to the amount of activity occurring in an area, then cow-paths will form where players and animals commonly walk, and isolated spots will develop undergrowth. To "inject" the activity of players into the model, a ruleset has only to refer to a model-external source such as a database or game server and set cell values accordingly. Alternatively, actors outside of the model can assert an effect on the model by increasing or decreasing values, e.g., an actor harvesting fish in an area removes a number of fish from a cell. Model elements can also "exject" into the game: a game server may be programmed to start a wildfire in a particular location based on the density of plants and the dryness of the soil.

Another advantage of a system according to certain embodiments of the invention is that predators and prey act and perform naturally without complex artificial intelligence ("AI") programming. For example, the same will flee, hide, and follow each other based on attraction to or repulsion from corresponding values in the modeled system. The behavior is natural, emergent, and dependent on many aspects of the model. For example, a player-induced rainstorm may cause a chain effect, causing soil moisture to increase, subsequent plant growth, attraction of herbivores, and the subsequent stalking of the area by predators.

A further advantage of a system according to certain embodiments of the invention is that when a user combines the components of a conceptual subsystem of the overall model into one layer with a set of rules that governs its evolution, the invention facilitates the modularization of that subsystem. For example, the water cycle or temperature can be complex single layers with many values which may be readily associated with a terrain layer or other module in order to re-use sophisticated, well-designed subsystems and rapidly build model environments.

Yet a further advantage of a system according to certain embodiments of the invention is that the system is not limited by the rules of cellular automata. Features such as pipes, emitters, drains, scrolling, and the like provide considerable advantages in virtual environment creation over the features available in cellular automata systems.

Other advantages will be apparent from the following description, including the figures and claims.

DETAILED DESCRIPTION

The following definitions are provided.

Figure 1:
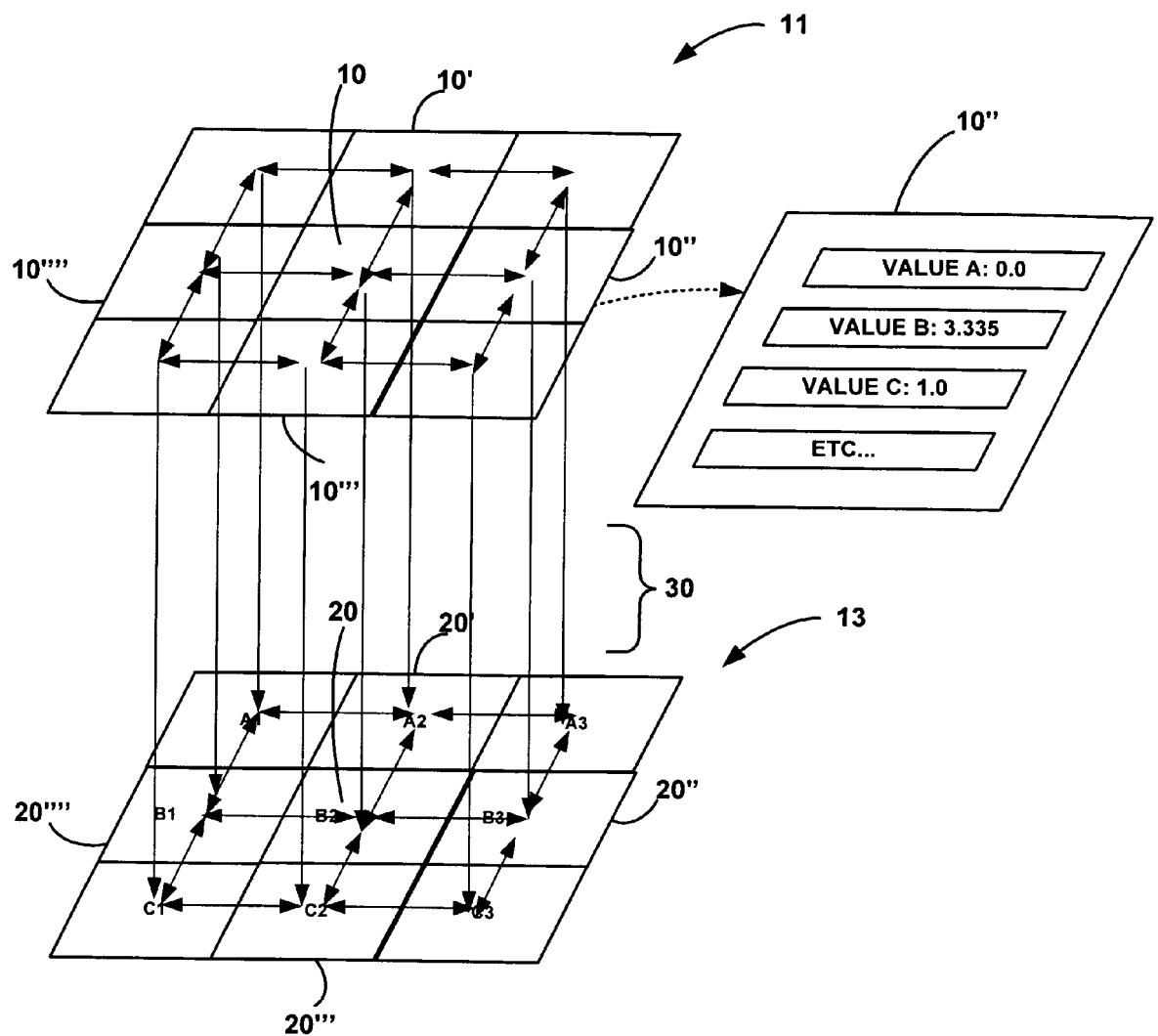
FIG. 1 shows a two-layer system according to an embodiment of the invention in which the layers are connected by pipes. A detailed view of a cell is also shown.

A "layer" is a grid or matrix of connected cells, and may even consist of a single cell. The grid may be two-dimensional, such that the cells are disposed in a plane. The layer may also be three-dimensional. Layers are often rectangular, but other layouts are possible, such as triangular, circular, or an arbitrarily complex geometric area. Each layer represents a feature or variable of the environment to be modeled: water, ground terrain, water vapor, clouds, reeds, fish, animals, etc. Layers are generally finite, but may be very large and may appear to extend indefinitely in some embodiments. Within a layer, a rule or ruleset may be defined to change values in reaction to, or taking into account the value of, neighboring cells. Referring to FIG. 1, two 3×3 layers are shown, a first layer 11 and a second layer 13. Layer 11 has cell 10 in the center and four neighboring cells 10', 10", 10''', and 10''''. The four neighboring cells are termed "nearest neighbor" cells. The four corner cells are termed next-nearest neighbor cells. A rule is typically defined to take account of values in the nearest neighbor cells, although some rules may also take account of the next-nearest-neighbor cells as well, or even more distant cells. For a substantially square layer oriented like a map, the extremes of the layer may be considered to be its northern, southern, eastern, and western edges.

A "cell" is a discreet unit within a layer. Cells contain discrete packets of one or more data values, each labeled by a user or by default. Referring again to FIG. 1, the detailed view of cell 10" is shown having a number of values, including value A of 0.0, value B of 3.335, and value C of 1.0. Other values may also be included. Typically, two values are included, and this is enough for many models. For example, a cell may have values that correspond to terrain and water, or reeds and fish, etc. In the absence of user-defined labels, the values may be termed "food" and "population". In many cases, when there is a "food" value and a "population" value in a cell, the "food" value may be considered as changing slowly, while the "population" value can be considered as being more dynamic, or changing more rapidly. In general, all cells in a layer are usually of the same type, e.g., all cells have the same number of values with the same labels.

A "rule" or "ruleset" or an "algorithm" is any mathematical expression which may take current or adjacent cell values, or both, as input variables. Rules are used to evolve the cell values within a layer. Cell values in other layers are usually not considered as input variables; rather, the effects of these are transmitted via pipes. External data sources may be considered, however, such as databases, look-up tables, etc. A single rule may be applied to multiple layers of cells, and multiple rules may be applied to any layer. One exemplary rule may be "if food value is greater than 2, increase population by 1".

An "emitter" is a combination of a "flux" value and a position, and is tied to a particular layer. Emitters are used to add a constant value to each cell in an area each cycle. As an example, an emitter may model a geyser or rain, which adds water to the surface ground layer in a real ecological system. An emitter may serve to control the simulation model, e.g., to start or end the same, or simply to influence the simulation. A negative emitter is termed a "drain" and can be employed to deduct a constant value from each cell. For example, a drain may be added to force water out of a layer to make certain that user-specified areas are not swamped.

"Growth" is a scalar value that affects the value of each cell in a layer each cycle. For example, a growth specification of "Water, 0.6" scales, in this case reduces, each Water value down by 40% each cycle (1×0.6=0.6, a 40% reduction). Growth specifications like this can simulate factors such as evaporation, drainage, erosion, natural growth, rainfall, or similar concepts of general loss or gain.

A "pipe" is generally a function that connects or "maps" a group of source layer cells with target layer cells. In more detail, a pipe is often a combination of a scalar value, an input layer and value type, and an output layer and value type. For example, referring to FIG. 1, pipes 30 are shown which connect a "source" or first layer 11 with a "target" or second layer 13. Generally, each pipe affects every cell in the output layer. In one embodiment, when a pipe is processed, a value in the input layer cell is multiplied by a scalar value and added to a value in the output layer cell. Pipes are used to propagate values from one layer to another. For example, a pipe may be used to map a layer of cells having "water" values to a layer of cells having "cloud" values. Such a pipe would simulate evaporation of water on the land which becomes water vapor in the air.

Because pipes connect layers, the orientation and position of one layer relative to another becomes important. Each pipe may include this orientation information. In a case where two layers have the same position and the same cell dimensions, then a one-to-one mapping is straightforward. In a case where the layers have different positions and different dimensions, however, a pipe may include an integer offset in two dimensions, and a scale. The layers are aligned, e.g., by the upper-left-most cell of each layer, and then scaled, and then offset by the specified value or values. The offset allows mismatched size layers to be situated relative to each other, and the scale allows mismatched size layers to translate from one size to another. For example, the scale can be used to map a 100×100 cell layer to a 2000×2000 cell layer, spreading the pipe of the 100×100 layer over the 2000×2000 layer. Other ways of mapping one layer to another may also be employed. In an extreme case, a single cell on one layer may be piped or mapped to all the cells on a target layer, or all the cells in one layer may be mapped to a single cell in the target layer.

Referring back to FIG. 1, the pipe 30 may have the following exemplary functionality: pipe 30 takes the value of population in layer 11, times 0.40, and adds the product to the value in layer 13, and the sum then replaces the prior value in layer 13. The first cell in layer 11 is denoted L11[1,1] and the corresponding cell in layer 13 is denoted L13[1,1]. The food values in those cells are denoted Food(L11[1,1]) and Food (L13[1,1]). If the initial value of Food in the first cell of the first layer is 10, such that $Food_0(L11[1,1])=10$, and the initial value of Food in the first cell of the second layer is 1, such that $Food_0(L13[1,1])=1$, then the effect of the pipe is to change $Food(L13[1,1])=Food_0(L13[1,1])+0.4*Food_0(L11[1,1])=1+0.4*10=1+4=5$.

A problem may arise with cells on the edge of the layer, which lack a complete set of nearest neighbor cells. In this case, the calculations may take into account the values of the cells along the opposite edge. In other words, with regard to cells along an edge of the layer, e.g., the southern edge, the nearest neighbor line of cells, south of the southern edge layer, may be arbitrarily chosen to be the northern edge of cells. In this way, the values can scroll out of one edge and into the opposite edge.

EXAMPLE ONE

Figure 2:
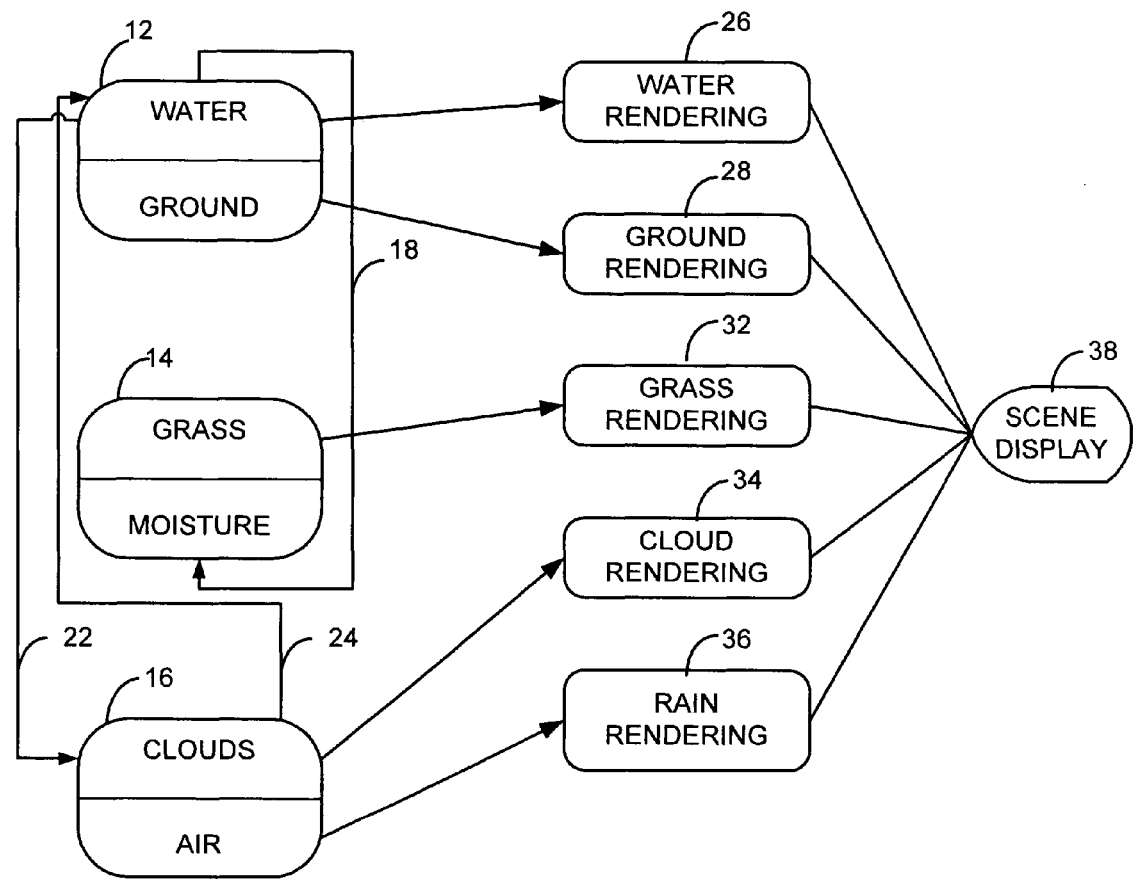
FIG. 2 shows a data flow diagram of a multi-layer system, showing pipes connecting certain of the layers, and the subsequent rendering and display of the resulting combined data.

As a first example, referring to FIG. 2, a system is shown that models vegetation, e.g., grass and the flow of various kinds of water over terrain. Three layers are shown: a water/ground layer 12, a grass/moisture layer 14, and a clouds/air layer 16. In layer 12, the "food" is ground, and the "population" is water. In layer 14, the "food" is moisture, and the "population" is grass. In layer 16, the "food" is air pressure, and the "population" is clouds.

Various pipes are also shown that connect the layers together. A pipe 18 connects layer 12 to layer 14. This pipe 18 maps water to moisture, and creates the food source necessary, i.e., moisture, for grass to exist on layer 14. Another pipe 22 connects layer 12 with layer 16. This pipe 22 maps water loss to clouds, and simulates evaporation of water on the land which then becomes water in the air or clouds. Yet another pipe 24 connects layer 16 with layer 12. This pipe 24 maps cloud loss, e.g., condensation, to water, and simulates the return of water from the air back to land.

Other pipes could also be employed, but are not shown here as they represent second- and higher-order effects. For example, moisture may also evaporate and thus lead to an increase in the cloud value.

The overall water population values are used to create a water rendering 26. Similarly, the overall ground population values are used to create a ground rendering 28, the overall grass population values are used to create a grass rendering 32, and the overall cloud population values are used to create a cloud rendering 34. With regard to a rain rendering 36, this may be developed by examining the rate at which the cloud population decreases, i.e., by examining the cell values piped between the cloud layer back to the terrain layer. The renderings 26-36 are then combined to create the overall screen display 38. More details of graphic renderings are provided below.

As noted above, each layer may have its own set of scalar terms, or rules, that control the rates of increase and decrease in each of the basic values of food and population. One class of rules pertains to growth rates. As examples, a food growth rate is the rate of change for every food value. A population growth rate is the amount of population that will grow from a quantity of food. The population growth rate is not the increase in the population itself, but rather how much is created from the paired food value. The food consumption rate is the rate at which food disappears based on population. The population death rate is the rate at which population disappears.

A set of expansion rules is defined to allow the food and population values to move from one cell to another. A first expansion rule is that population values in a cell will spread to their nearest neighbors only if the total population and food in the cell is greater than the total population and food in neighbor cells. This rule simulates, e.g., fluid moving off higher-terrain areas to lower-terrain areas. A second expansion rule is that population values spread to the nearest-neighbor cells, e.g., those that are east, west, north, and south of the subject cell.

For both rules, conservation of values is used. For example, if a surplus amount from a source cell is distributed, it is done so in an equal manner among the target cells, and the value in the source cell is decremented accordingly. In the above example, the first rule may be used in layer 12 to simulate water movement on the ground, the second rule may be used in layer 14 to simulate the spread of grass, and the first rule may be used in layer 16 to simulate the spread of water vapor along air currents.

In the above example, cell values in each layer are adjusted each cycle according to the rules defined for that layer. Simple rules may include, e.g., "subtract 1 from Food", "multiply Food value by 0.88", "set Food value to the average Food value of all neighbors", "increase Moisture by ten times the sine of the current cycle number", etc. A more complicated example might be "compute the current value of cell water by searching for 'displacement' of neighboring cells, according to a simple fluid movement model based on height of land and depth of water in adjacent cells". Configurations of the system may be used to model, e.g., the flow of water or accumulation of snow over terrain, the migration of animals between food sources, the spread and health of plant life over terrain, etc.

EXAMPLE TWO

As another example, to model the migration of animals between food sources, e.g., fish in water, a configuration with just two layers is sufficient. The bottom layer is the "terrain/water" layer, having values of Height and Water. The top layer is the "reeds/fish" layer, having values of Reeds and Fish.

As examples of initial conditions, the bottom layer's Height values are initialized with a "height map" of terrain, which describes the height, e.g., above sea level, of each point in the terrain. The bottom layer's Water values are initialized with a flat, high value. The top layers' Reeds values are initialized to zero and its Fish values may be randomly set.

The model may also be given rules such as the bottom layer's Height values remain unchanged for all cycles. This layer may also be given a rule which causes the Water values to "flow" downhill.

A pipe from the bottom layer to the top layer may be added, which increases the top layer's Reeds values according to the amount of Water in the bottom layer. If there is too much Water, e.g., more than 6.0, the Reeds value is zero. If there is too little Water, e.g., less than 2.0, the Reeds value is again zero. Between those values, Reeds may be set on a smooth curve from a value of zero to one and back to zero. A second rule may also be added which sets the top layer's Fish value to zero if there is too little Water, e.g., less than 0.5.

The top layer may be given a rule that "flows" Fish values towards those cells which contain the most Reeds. Fish, in integral quantities, may be moved from their current cells to neighboring cells that contain more food. This simulates a real system in which fish are only aware of the immediate area around them. This technique also allows different groups of fish to accumulate in different local maxima.

A similar rule may take into account the consumption of food by the fish. Fish in a cell will consume food from the cell, thus making the cell less desirable to the fish, and causing them to migrate in search of richer food sources in successive iterations of the simulation. Further complexity could be added, e.g., placing a maximum on the fish population in a given cell, thus preventing overcrowding.

As this example evolves, the water will settle downhill, the reeds will settle at the edges of the water, and the surviving fish will move towards the highest concentration of reeds. Reeds are consumed by the fish, which then migrate to other patches of reeds, while the reeds slowly grow back over time.

Initial conditions may be set in several ways. First, initial conditions may be set by seeding each layers initial food values using, e.g., Perlin noise. Another way is to import "maps" of food values. For example, grayscale bitmaps of terrain may be imported for initial terrain or ground states. Corresponding bitmaps of clouds over terrain may be employed for the cloud initial states.

In one implementation, to model water flow, the user may specify as initial conditions the dimensions of a virtual terrain, the contour of the terrain, i.e., the height at each point, starting water depths on the terrain, and a simple rule for altering water depth values in terms of height values.

In another implementation, the initial population conditions may be simply set at zero, and emitters employed to start populations in the model. For example, an emitter may be used in the above example to create a source of water in layer 12. For the reasons discussed above in connection with the definition of emitters and drains, a drain may be employed to remove water from a user-specified area. In the example, any water removed from layer 12 is automatically disposed in layer 16. Once in layer 16, the water will follow its own expansion rules, e.g., along air current values, and may encounter drains that eventually dispose the water back into layer 12.

One simple way of seeding the layers is by use of a functional distribution of population or food values, or both. For example, a simple sine wave distribution may be employed to seed the initial values. Such an implementation would be especially useful where the entire evolutionary process, i.e., the evolution from an essentially blank landscape, is not pertinent to gameplay or is otherwise not of interest.

Additional features may be provided to make the virtual environment even more interesting. One additional feature that may be added to models is an artificial barrier. Layers may be inserted with artificial barriers to prevent movement and spread of certain values, as might be expected of a man-made wall, force field, radii of radioactive or toxic influence, design-dictated "safe space", etc.

Further features that may be added to models are growth patterns for populations. These growth patterns provide for a small chance of spontaneous population growth. Dynamic systems with elements that change in response to one another can wander into imbalance, where some elements are permanently destroyed, even with a model that is on average self-sustaining. To facilitate the self-healing of such models, the growth pattern for populations may be inserted. In this way, every cell with a positive food value has a predetermined, usually small, chance on each cycle of generating a population value for that same cell. Thus, for example, even a relatively simple model of soil and grass, in which all the grass has been eaten by herbivores, can spontaneously create new grass where the conditions are suitable.

The method by which data values in all cells are updated can vary. One implementation alters the data values in every cell "at once", in discrete time slices, according to the rules employed. The rules would be applied to each cell individually, according to its neighboring cells as appropriate, and according to the pipes. A "cycle time" may be employed, which is the unit of time during which rules and pipes calculate new values for each cell individually, and then replaces the values of all data items in all cells with the new values before completing the cycle.

The engine for the system, e.g., the game engine, has a base cycle rate termed here a "tick". The tick may be related to the processor clock. Layers may have individual update rates, which are based on these ticks. Each layer may also have a property of an "update rate", which the engine uses to determine how often to process that layer. For example, one layer may have a "tick-1" and another layer a "tick-3". In this case, the first layer would run three times as often as the second layer.

One global way to configure the engine is by setting the "frame rate" target for the tick. This may be set by a user to some number of, e.g., milliseconds, that the engine uses as a gauge to determine how fast to run. For example, a frame rate of 100 ms means that the engine will compute a tick and be ready to begin the next tick 100 ms later. Users can employ and adjust the frame rate and the tick system for layers to approximate a model speed, so that the system may be run as rapidly or as slowly as desired.

The order of operation of the engine is as follows:

```
For each model cycle,
    For each layer,
        For each rule,
            Determine the new value for each cell.
        End rule
        Update all cells with their new values.
    End layer
    For each emitter,
        Determine the new value for each cell.
        Update all cells with their new values.
    End emitter
    For each pipe,
        Determine the new value for each cell in the target layer.
    End pipe
    For each growth value,
        Determine the new value for each cell.
        Update all cells with their new values.
    End growth value
End cycle.
```

Of course, the above ordering is merely exemplary. The exact ordering is configurable by the user. For example, pipes may be processed before rules for a given model.

Before or after each cycle, the engine may save or export the state of any cell, layer, or model for visualizers or external applications to use or display. The engine may also save its data at any time to avoid recalculating in the event of interruption. This feature is useful for large models, with many layers, cells, pipes, and rules.

External systems may interact with the model to extract information, to inject or alter values in the model, and to alter the model's parameters.

One type of external system that interacts with the model is an animal agent system. This is a type of AI that controls the behavior of animal agents in a virtual environment. The environment itself is modeled by systems as have been described, and the AI system provides an animal agent subsystem that acts on the virtual environment by, e.g., changing the values of a variable in a cell. In other words, the model defines the behavior of the environment and the AI system defines the behavior of the animals. For example, an AI agent may be a caribou. The caribou has a location that corresponds to a location in the virtual environment, e.g., a position on the terrain of the model. The AI agent may query the model for information about the locality of the environment, such as the health and quantity of grass in the area and in the surrounding areas. The AI agent system then makes a decision that will in turn impact the virtual environment, e.g., such as the caribou choosing to eat a portion of the grass. If the caribou chooses to do so, then the change in the grass population would be injected into the model. On the next cycle, the grass in the cell will be depleted, which in turn has other consequent effects, such as on the moisture of the soil. Any agents that query for the status of the grass in that cell will find that the same has been depleted.

Another type of external interaction with the system is other player characters. In particular, in a multiplayer environment, player characters operated by other players may affect food and population values in a cell by, e.g., consuming food, causing the other player characters to leave the cell, etc. Such interactions impart an often-desired additional layer of complexity to the model or virtual environment. In a massively multiplayer online ("MMO") game, such external agents may have a considerable impact on resources and gameplay.

One configuration of the system has more than one software process computing the values, per the rules or pipe functions, for the changes in cell values. In this distributed mode, the work of calculating a cycle is split among multiple processors. A central, controlling processor, the process manager, directs the distributed computation and holds the "complete" model after each cycle.

Figure 3:
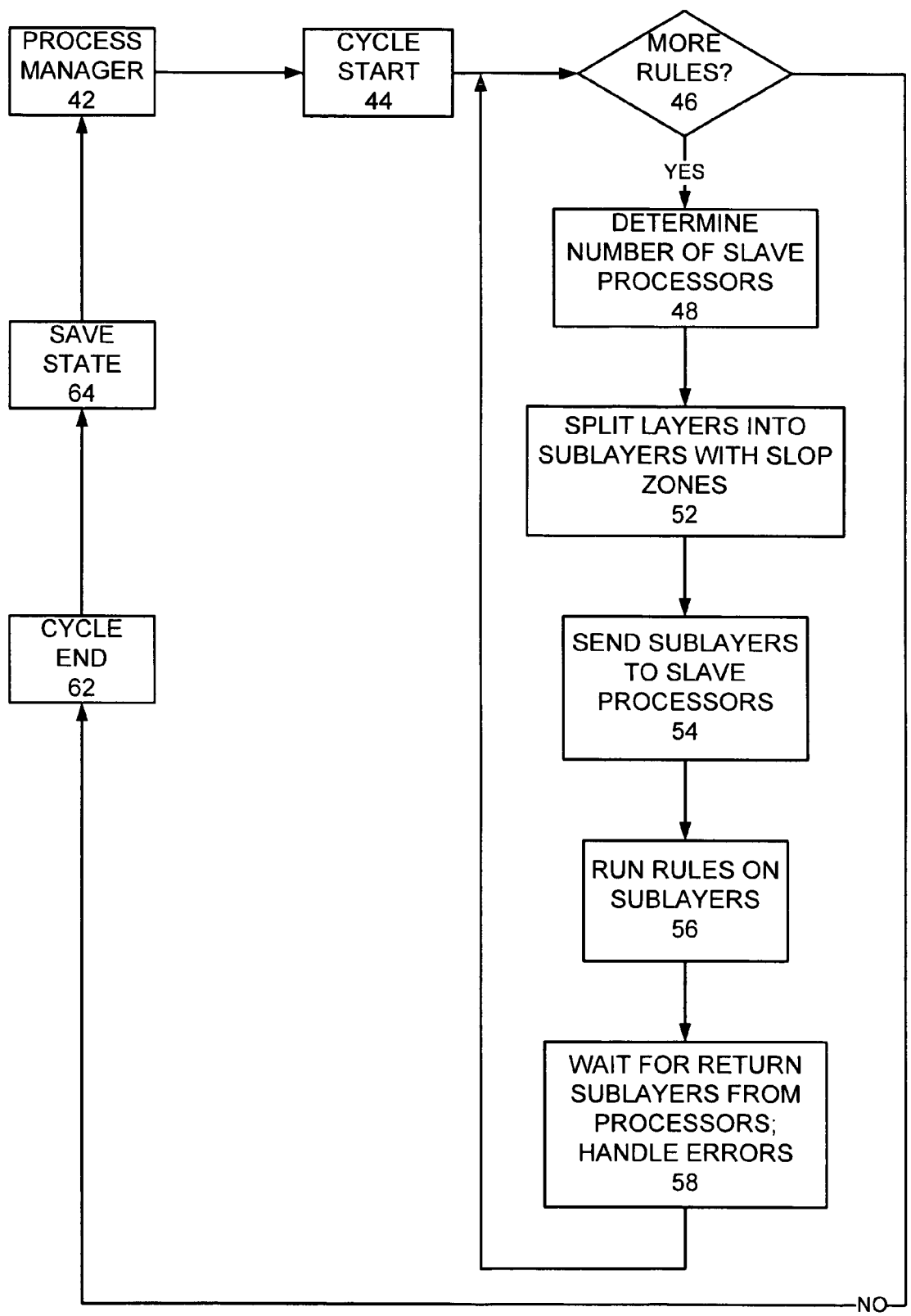
FIG. 3 shows a flowchart of a process manager that controls and directs the distribution of rule processing for each cycle in a distributed processing system.

Referring to FIG. 3, a flowchart is shown of the process manager that controls and directs the distribution of rule processing for each cycle in a distributed processing system. In the distributed processing system, the process manager is called (step 42) and the cycle starts (step 44).

First, a check is made as to whether there are rules to be processed (step 46). If so, the process manager determines how many slave processors it has available for distributed processing (step 48). The process manager then splits the layers into sublayers with overlapping or "slop" zones (step 52). The slop zone account for the need to compute cell values based on nearest-neighbor cells, as is described below. The sublayers are usually of equal size, though they need not be, especially in the case where the slave processors are of differing capabilities. As a typical example, a 30×30 layer may be split into three 10×30 sublayers.

Figure 4:
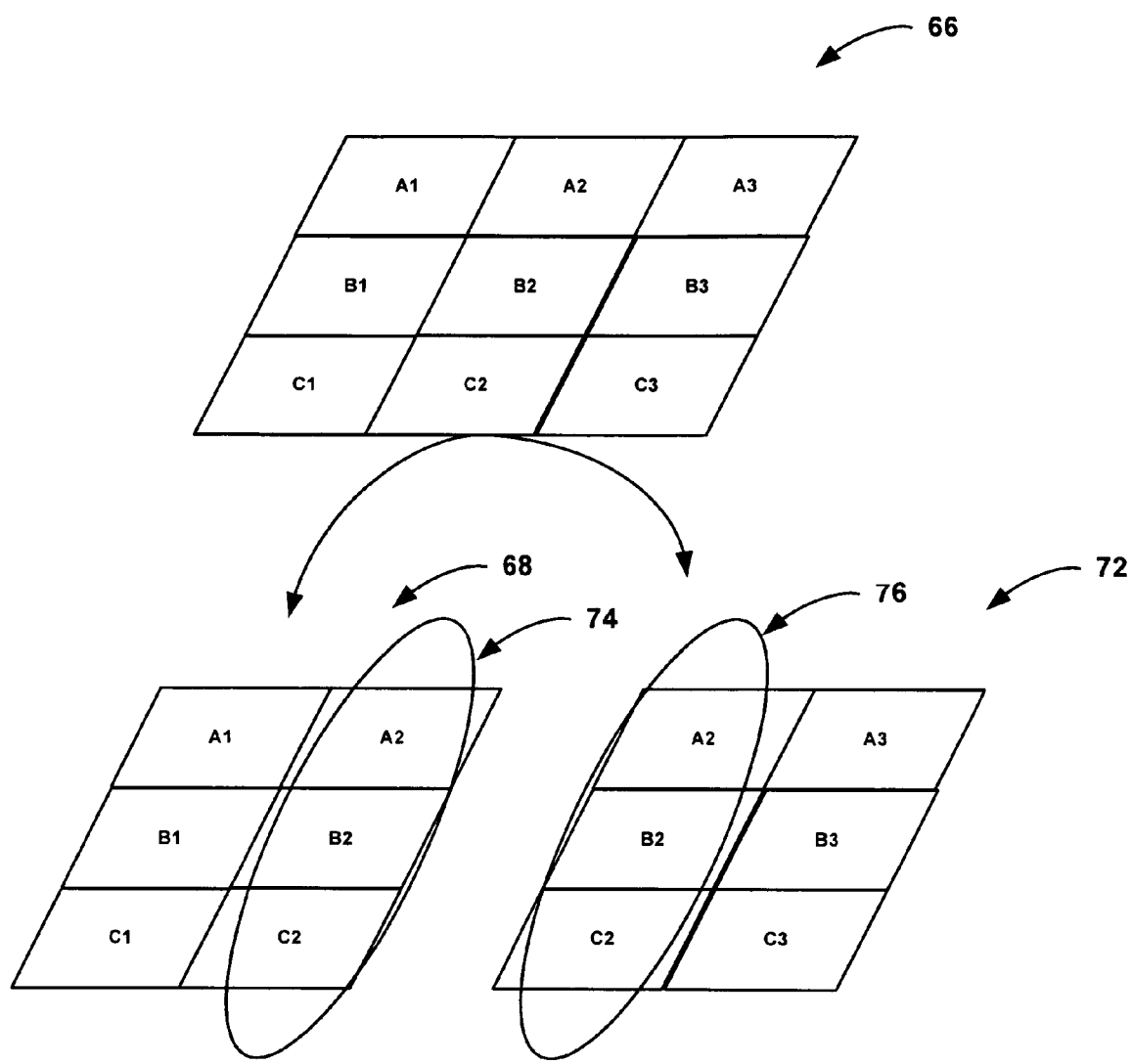
FIG. 4 shows how the process manager of FIG. 3 divides layers into overlapping sublayers for distributed processing.

Referring to FIG. 4, a schematic diagram is shown of how the process manager of FIG. 3 divides layers into overlapping sublayers for distributed processing. In this case, a simple example is shown of a 3×3 layer 66 being sectioned into two overlapping 3×2 sublayers 68 and 72. Layer 66 contains cells A1-A3, B1-B3, and C1-C3. Sublayer 68 contains cells A1, B1, and C1, as well as A2, B2, and C2. Sublayer 72 contains cells A3, B3, and C3, as well as A2, B2, and C2.

In this way, each sublayer is buffered with a slop zone of configurable size, which is usually one row or column of cells. This slop zone serves to expand the sublayer into its neighbors. In FIG. 4, slop zones 74 and 76 each contain cells A2, B2, and C2. In the case of the 30×30 grid, the sublayers would be expanded into 11×30, 12×30, and 11×30 sublayers, such that each sublayer overlaps into neighbors by one row or column of cells.

The purpose of the slop zone is to allow each slave processor access to cells neighboring the cells for which it is responsible for computing values, as rules and algorithms often compute the value of a cell based on the values of its nearest neighbors. The slop zone may be made larger if cells beyond nearest-neighbors are to be included in the calculation.

In one implementation, the process manager performs the majority of the processing for each cycle locally, and only employs distributed processing when rules are applied, as rule application typically requires the most intensive processing.

The process manager assigns each slave processor a sublayer and a rule. It sends the rule and the specification for each cell in the sublayer to each processor (step 54). The slave processors then perform the requested rule calculations on their assigned sublayers (step 56). The process manager waits for each slave to return a calculated sublayer with the rule applied (step 58). Errors are also handled in this step. The process manager then combines the sublayers back into a single layer, discarding slop zone duplicate cells. If no more rules remain to be run (the "NO" branch of step 46), the cycle can end (step 62) and the state can be saved (step 64).

Various methods or protocols can be used by which the process manager and the slave processor can communicate. For example, communication may be accomplished with a custom TCP/IP protocol, SOAP, RMI, inter-process communication methods such as named pipes or shared memory or distributed shared memory, CORBA, or the like.

In a related implementation, instead of each slave processor being assigned a sublayer and a rule during each cycle, and transferring the entire specification of each sublayer to the slave and back to the processor, each processor is assigned "ownership" of a sublayer. In this mode, the process manager holds the slop zone contents and coordinates the values of slop zone cells between slave processors. It synchronizes the operation of the model and may query slave processors at any time to receive a "snapshot" of the global state of the model or of any sublayer or subsection of a sublayer.

In a further related implementation, one of the slave processors that may be employed is the graphics processing unit. This may be a particularly advantageous choice for the following reasons. The CPU is then not taxed with computing additional parts of the simulation. In addition, it is noted that hardware cards generally employ a graphic processing unit that works with textures. Every cell of the texture, or "texel", is a value within a certain range that corresponds to the color value at that location. So layers according to embodiments of the present invention may be treated as texture surfaces. This texture may then be passed into, e.g., a pixel shader code which contains the algorithm needed. The results of this pixel shader code are written to a destination render target which is just another texture. Each cell in this final texture contains the results of the algorithm. Since graphics processing units are optimized for such work on textures, leveraging this processor to perform the algorithm computations provides an increase in total processing power.

Embodiments of the invention have been described as ways to create a virtual environment that evolves. Users can create these model environments either by total specification, e.g., a database, spreadsheet, XML file, text file, system properties, etc., or by interaction through a graphical interface.

In more detail, one implementation is as a service or system, e.g., executable software, available to an online game server infrastructure. In this implementation, the system would be well-suited to long-term modeling and persistent-state worlds that change over time, and can add much complexity to such an environment with an independent process and relatively modest processing requirements. In addition, because the values being modeled are easily abstracted, the system is reusable, and can work as a "toolkit" component that can plug into a variety of different server architectures and fulfill a variety of different modeling roles.

Another implementation is as a design tool, allowing a user to create a much more believable environment on a much more rapid time scale than traditional modeling or world-design tools. Even if the finished environment does not have the system itself incorporated into the gameplay, or has entirely different quantities being modeled during gameplay than were modeled during content creation, the finished environment still benefits from the believability, consistency, and ease of content creation allowed by such a complex simulation. Such an implementation is particularly suited for single-player or short-duration games, where the long-term effects of, e.g., water flow, plant growth, or erosion may not have time to be noticed.

Figure 5:
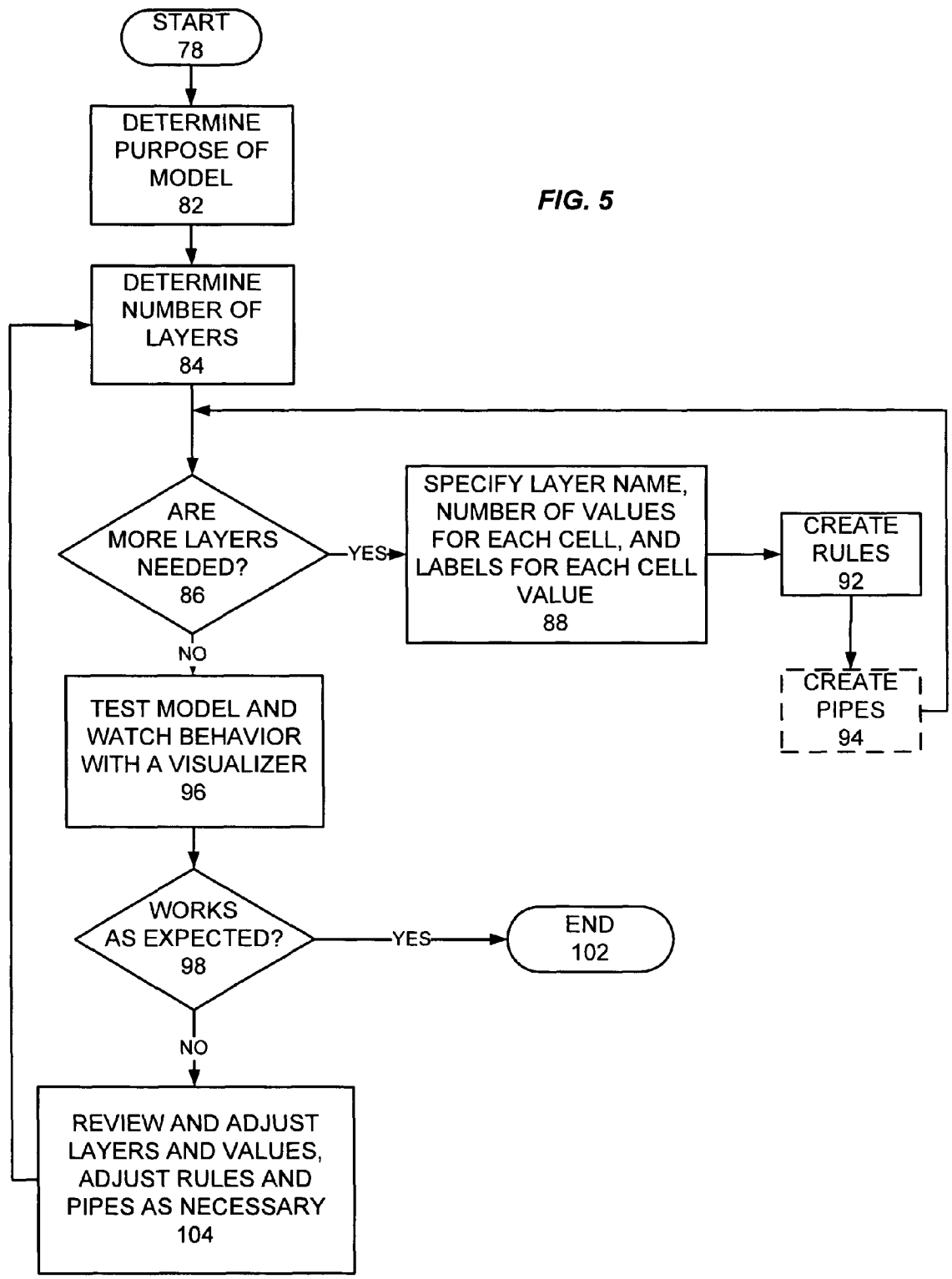
FIG. 5 shows an exemplary user interaction scenario, in which a user creates a virtual environment employing an embodiment of the invention.

Referring to FIG. 5, a flow diagram is shown illustrating how a user may create or adjust a model all at once or in a step-by-step fashion. The method starts (step 78) and the user determines the purpose of the model (step 82). Depending on what is to be modeled, and the level of complexity desired, the user determines an initial number of layers (step 84). The user then reviews if additional layers are needed (step 86). If not, then the model is tested and its behavior visualized (step 96). If the system works as expected (step 98) and the "YES" branch following, the method ends (step 102). If the system fails to work as expected, then a review of the layers, rules, and pipes may be performed (step 104), and the flow branches to the number of layers determination (step 84).

Returning to the decision point of if more layers are needed (the "YES" branch of step 86), for each additional layer added, specifications are made of the layer name, number of values in each cell, and labels for the cell values (step 88). Rules are created to govern evolution of variables in the layer (step 92). If necessary or desired, pipes may be created to link the layer with other layers (step 94). The process may then branch to the decision point of if more layers are need (step 86).

With this method, the user may edit or adjust the model at any time, including during engine execution. In this case, changes may take affect at the next cycle.

Once the system has created a simulation, model, or virtual environment, the data can be read from any or all layers and provided to a graphics pipeline.

To represent the terrain with a height field, each height pole is mapped to one terrain value in each cell, giving the shape of the terrain landscape. A water mesh may be created in the same way. For typical rules, the water mesh will flow and spread over the more fixed terrain landscape.

Textures on the terrain can be associated with the grass values in another layer. A simple look-up table of grass values ranges corresponding to different textures can be established. To provide more variation in the mapping, a two-dimensional table of grass ranges to water ranges can be created. In this way, the texture of any polygon in the terrain may be chosen according to how much water and grass exist in the locality. In one exemplary system, a table of six water ranges, from "very dry" to "underwater" can give an appropriate texture to be applied to each terrain polygon.

Along with texturing the terrain polygons, grass polygons, i.e., polygons representing different types or amounts, or both, of grass may be employed. A table similar to the terrain polygon table may be used to select the texture to be applied to the grass polygon. For even more detail, the actual value of grass may be employed to scale the grass polygon vertically in size, e.g., to simulate grass growing or dying out.

Examples of texturing follow. A shoreline texture may be applied on the water mesh. As the water value of each point on the mesh is usually known, shorelines may be detected by checking water and terrain values and a different texture applied to the water mesh polygons on the shoreline.

As noted above, water movement from layer 16 to layer 12 of FIG. 2 may be associated with rain. A particle display system may be associated with this pipe 24 and thereby provide dynamic placement of rain particles.

For even more realism, large changes in water movement from, e.g., expansion rules, can be tracked and provide locations where to place sound markers for rushing water and babbling brooks.

In any of these cases, transitions from one polygon to an adjacent one may be made to appear smoother by graphically "smearing" the boundary layers of the adjacent cells. One way to do this is by a simple method of interpolation between the adjacent variable values in order to calculate appropriate values for placement along a boundary layer. Other ways will also be apparent given this teaching.

In some cases, the graphics processing and rendering on the server side may be coarse, and when transmitted to the client side may acquire greater resolution via interpolation, smearing, etc. In this way, server processing may be minimized.

Figure 6:
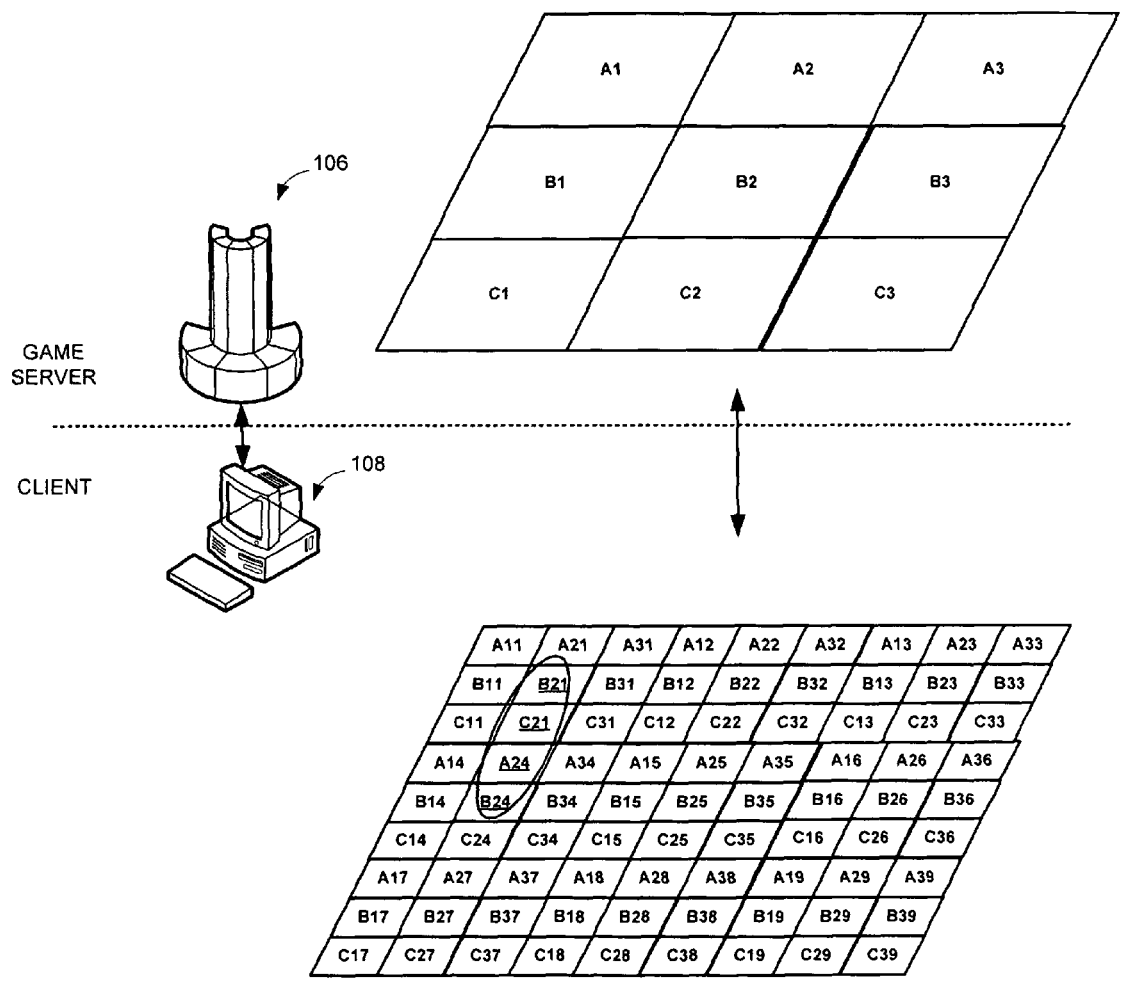
FIG. 6 shows a client/server architecture that may be employed with the invention, where the data on the client side has higher resolution than the corresponding data on the server side.

For example, referring to FIG. 6, a client/server system is shown with game engine server 106 and a client system 108. The server 106 runs the game engine application, maintains the overall game virtual environment, and sends information to the game client 106 pertinent to the player characters and environment local to the client. In the figure, server 106 operates on a set of data shown as nine cells A1-A3, B1-B3, and C1-C3. When client 106 receives and displays this data, the data can be displayed with greater resolution, e.g., cell A1 can be resolved into nine cells A11-A31, B11-B31, and C11-C31. Cells A2-A3, B1-B3, and C1-C3 can be resolved similarly.

As one example of graphic smearing using interpolation, and referring to the cells with underlined indices, the polygon type corresponding to a server side cell may be made the same as the center cell of the set of nine corresponding cells on the client side. For example, the polygon type of cell A1 may be made the same as the polygon type of cell B21. Similar, the polygon type of cell B1 may be made the same as the polygon type of cell B24. The cells on the client side between B21 and B24, i.e., C21 and A24, may have their polygon types determined by a smooth interpolation between that of cells B21 and B24.

According to the present invention, as fully described above, a system is provided to automate the creation and evolution of much of a game's content, including much of the game's environment. The creation and evolution are dynamic and responsive. A rule engine creates and operates on a number of layers, each layer having a number of discreet data packets termed cells. The engine causes each cell to change over time in response to neighboring cells, as well as from cells in adjacent or connected layers via pipes. This process emulates the dynamic, complex, and emergent behaviors which characterize living biological and ecological systems. In such systems, the results may be complicated and may lead to unexpected effects. To configure the system for a particular situation, a user interacts with the implementation, likely in software, setting constraints and labels for the emulation.

While the invention has been described in the context of game content and environments, it should be clear to one of ordinary skill in the art, given this teaching, that the invention is much broader than the embodiments shown. For example, the invention may be applied to modeling ecological, biological, sociological, economic, and other such systems. Indeed, any software that models a changing or evolving system, i.e., one with parameters that change according to rules, may benefit from incorporation of the invention. Moreover, while the invention has been primarily described in the context of two-dimensional layers, and it has further been noted that three-dimensional layers are possible, it should be clear that a three-dimensional layer is not the same as a two-dimensional layer with pipes connecting the layers. Rather, where a three-dimensional layer is employed, the same may also be connected via pipes to other layers, with appropriate modifications if necessary in the mapping method. In addition, it should be noted that the terms virtual environment, system, virtual world, ecosystem, ecological system, model, and the like have been employed substantially interchangeably in this specification, the phrase chosen is dependent on the context.

Accordingly, the scope of the invention is limited only by the claims appended hereto.

The invention claimed is:

1. A method for modeling a virtual environment with a computer system, comprising:

a. forming a plurality of layers of data using a computer system, including at least a first layer and a second layer, each of the first and second layers being configured to alternatively be either a source layer or a target layer, the source layer and target layer being the same or different sizes, each layer among the plurality of layers of data representing a distinct variable of the virtual environment being modeled and including a plurality of cells, each cell containing a first datum and a second datum, the first datum corresponding to a different variable than the second datum, the plurality of cells in the first layer corresponding to a plurality of cells in the second layer by a first function;

b. connecting layers among the plurality of layers of data using one or more pipes, each of the one or more pipes being configured 1) for mapping a group of one or more cells in the source layer to a group of one or more cells in the target layer so that cell data is propagated between the source layer and target layer and 2) to identify orientation information describing an orientation of the source layer with respect to the target layer, the orientation information including at least one of integer offset in two dimensions and a scale factor, the integer offset being zero or non-zero and the scale factor being equal to, less than, or greater than unity;

c. operating on at least one of the data from the cells in the first layer with a second function to yield respective target data, the operating including processing the at least one of the one or more pipes;

d. basing a calculation at least partially on the target data, the calculation performed on a respective datum in a corresponding cell in the second layer; and e. altering at least one of the data in at least one of the plurality of cells in each layer according to a rule, wherein the altering includes: i. dividing at least one layer of the plurality into a plurality of overlapping sublayers, wherein certain cells are duplicated in more than one sublayer;
ii. sending the data from each sublayer to separate slave processes along with the rule;
iii. receiving the altered data from each sublayer back from the slave processes; and
iv. combining the sublayers and discarding duplicate data to create one layer containing altered data.

2. The method of claim 1, further comprising providing an emitter which increases the value of at least one data in a cell.

3. The method of claim 1, further comprising providing a drain which decreases the value of at least one data in a cell.

4. The method of claim 1, wherein the rule uses data in cells adjacent to said at least one of the plurality of cells.

5. The method of claim 1, wherein the operating includes multiplying a datum in a cell in the first layer by a scalar, and wherein the calculation includes adding a resulting product of the multiplication to a respective datum in one or more corresponding cells in the second layer, and inserting a resulting sum into the one or more corresponding cells in the second layer.

6. The method of claim 1, further comprising setting an initial value for each of the data for each of the cells in each layer.

7. The method of claim 6, wherein each initial value is zero, and further comprising providing an emitter which increases the value of at least one data in at least one cell.

8. The method of claim 1, further comprising providing a growth pattern for a layer.

9. The method of claim 1, wherein at least one of the cells of the plurality includes data corresponding to an external agent.

10. The method of claim 9, wherein the external agent is selected from the group consisting of: an external artificial intelligence agent and a player character.

11. The method of claim 1, wherein the number of cells in the first layer is equal to the number of cells in the second layer.

12. A non-transitory computer-readable medium having computer-executable instructions for performing the steps recited in claim 1.

13. A method for creating a virtual environment with a computer system, comprising:
a. forming a plurality of layers of data using a computer system, including a first layer and a second layer, each layer including a plurality of cells, each cell containing a first datum and a second datum, the first datum corresponding to a different variable than the second datum, the plurality of cells in the first layer corresponding to a plurality of cells in the second layer;
b. operating on at least one of the data from the cells in the first layer with a function to yield respective target data;
c. basing a calculation at least partially on the target data, the calculation performed on a respective datum in a corresponding cell in the second layer; and
d. altering at least one of the data in at least one of the plurality of cells in each layer according to a rule, wherein the altering includes: i. dividing at least one layer of the plurality into a plurality of overlapping sublayers, wherein certain cells are duplicated in more than one sublayer;
ii. sending the data from each sublayer to separate slave processes along with the rule;
iii. receiving the altered data from each sublayer back from the slave processes; and
iv. combining the sublayers and discarding duplicate data to create one layer containing altered data;
e. wherein the number of cells in the first layer is not equal to the number of cells in the second layer, and wherein a value of target data is used in a plurality of calculations on data in a plurality of corresponding cells in the second layer.

14. The method of claim 1, wherein the data in each cell includes a food value and a population value, and wherein the altering includes spreading population values to a nearest neighbor cell only if the total population and food in a cell is greater than in the nearest neighbor cell.

15. The method of claim 1, wherein the data in each cell includes a food value and a population value, and wherein the altering includes spreading population values to each of the nearest neighbor cells.

16. The method of claim 1, wherein the altering occurs at a tick rate, and wherein the tick rate of the first layer is not equal to the tick rate of the second layer.

17. A method for creating a virtual environment with a computer system, comprising:
a. forming a plurality of layers of data using a computer system, including a first layer and a second layer, each layer including a plurality of cells, each cell containing a first datum and a second datum, the first datum corresponding to a different variable than the second datum, the plurality of cells in the first layer corresponding to a plurality of cells in the second layer;
b. operating on at least one of the data from the cells in the first layer with a function to yield respective target data;

c. basing a calculation at least partially on the target data, the calculation performed on a respective datum in a corresponding cell in the second layer; and d. altering at least one of the data in at least one of the plurality of cells in each layer according to a rule, wherein the altering includes:
  i. dividing at least one layer of the plurality into a plurality of overlapping sublayers, wherein certain cells are duplicated in more than one sublayer;
  ii. sending the data from each sublayer to separate slave processors along with the rule;
  iii. receiving the altered data from each sublayer back from the slave processors; and
  iv. combining the sublayers and discarding duplicate data to create one layer containing altered data.

18. A method for modeling a virtual environment with a computer system, comprising:

a. implementing the virtual environment on the computer system, the virtual environment having a plurality of layers of data including at least a first layer and a second layer, each of the first and second layers being configured to alternatively be either a source layer or a target layer, the source layer and target layer being the same or different sizes, each layer among the plurality of layers of data representing a distinct variable of the virtual environment being modeled and including a plurality of cells containing at least two data values, each value corresponding to a different variable, a variable in the first layer related to a respective variable in the second layer by a first function;

b. connecting layers among the plurality of layers of data using one or more pipes, each of the one or more pipes being configured 1) for mapping a group of one or more cells in the source layer to a group of one or more cells in the target layer so that cell data is propagated between the source layer and target layer and 2) to identify orientation information describing an orientation of the source layer with respect to the target layer, the orientation information including at least one of integer offset in two dimensions and a scale factor, the integer offset being zero or non-zero and the scale factor being equal to, less than, or greater than unity;

c. using the computer system, operating on at least one of the data from the cells in the first layer with a second function to yield respective target data;

d. basing a calculation at least partially on the target data, the calculation on a respective datum in a corresponding cell in the second layer, the operating on the at least one of the data including processing the at least one of the one or more pipes; and e. altering at least one of the data in at least one of the plurality of cells in each layer according to a rule, wherein the altering includes: i. dividing at least one layer of the plurality into a plurality of overlapping sublayers, wherein certain cells are duplicated in more than one sublayer;
  ii. sending the data from each sublayer to separate slave processes along with the rule;
  iii. receiving the altered data from each sublayer back from the slave processes; and
  iv. combining the sublayers and discarding duplicate data to create one layer containing altered data.

19. The method of claim 18, wherein the virtual environment is a massively multiplayer online game, and wherein the data in at least one cell in at least one layer is dependent on the actions of at least one player character.

20. The method of claim 18, wherein the rule uses data in cells adjacent to said at least one of the plurality of cells.

21. A non-transitory computer-readable medium having computer-executable instructions for performing the steps recited in claim 18.

22. A method for modeling a virtual environment with a computer system, comprising:

a. forming a plurality of layers of data, including at least a first layer and a second layer, each of the first and second layers being configured to alternatively be either a source layer or a target layer, the source layer and target layer being the same or different sizes, each layer among the plurality of layers of data representing a distinct variable of the virtual environment being modeled and including a plurality of cells containing data corresponding to a variable;

b. connecting layers among the plurality of layers of data using one or more pipes, each of the one or more pipes being configured 1) for mapping a group of one or more cells in the source layer to a group of one or more cells in the target layer so that cell data is propagated between the source layer and target layer and 2) to identify orientation information describing an orientation of the source layer with respect to the target layer, the orientation information including at least one of integer offset in two dimensions and a scale factor, the integer offset being zero or non-zero and the scale factor being equal to, less than, or greater than unity;

c. using a computer system, operating on the data from the cells in the first layer with a function to yield target data, the operating including processing the at least one of the one or more pipes;

d. distributing the target data to corresponding cells in the second layer; and e. altering at least one of the data in at least one of the plurality of cells in each layer according to a rule, wherein the altering includes: i. dividing at least one layer of the plurality into a plurality of overlapping sublayers, wherein certain cells are duplicated in more than one sublayer;
  ii. sending the data from each sublayer to separate slave processes along with the rule;
  iii. receiving the altered data from each sublayer back from the slave processes; and
  iv. combining the sublayers and discarding duplicate data to create one layer containing altered data;

f. wherein the data in each cell includes a food value and a population value, and wherein the altering includes spreading population values to a nearest neighbor cell only if the total population and food in a cell is greater than in the nearest neighbor cell.

23. A method for creating a virtual environment with a computer system, comprising:

a. forming a plurality of layers of data, including at least a first layer and a second layer, each of the first and second layers being configured to alternatively be either a source layer or a target layer, the source layer and target layer being the same or different sizes, each layer among the plurality of layers of data representing a distinct variable of the virtual environment being modeled and including a plurality of cells containing data corresponding to the variable;

b. connecting layers among the plurality of layers of data using one or more pipes, each of the one or more pipes being configured 1) for mapping a group of one or more cells in the source layer to a group of one or more cells in the target layer so that cell data is propagated between the source layer and target layer and 2) to identify orientation information describing an orientation of the source layer with respect to the target layer, the orientation information including at least one of integer offset in two dimensions and a scale factor, the integer offset being zero or non-zero and the scale factor being equal to, less than, or greater than unity;
c. using a computer system, operating on the data from the cells in the first layer with a function to yield target data, the operating including processing the at least one of the one or more pipes;
d. distributing the target data to corresponding cells in the second layer; and
e. altering at least one of the data in at least one of the plurality of cells in each layer according to a rule, wherein the altering includes: i. dividing at least one layer of the plurality into a plurality of overlapping sublayers, wherein certain cells are duplicated in more than one sublayer;
  ii. sending the data from each sublayer to separate slave processes along with the rule;
  iii. receiving the altered data from each sublayer back from the slave processes; and
  iv. combining the sublayers and discarding duplicate data to create one layer containing altered data;
f. wherein the data in each cell includes a food value and a population value, and wherein the altering includes spreading population values to each of the nearest neighbor cells.

24. A method for modeling a virtual environment with a computer system, comprising:
a. forming a plurality of layers of data using a computer system, including at least a first layer and a second layer, each of the first and second layers being configured to alternatively be either a source layer or a target layer, the source layer and target layer being substantially the same size, each layer among the plurality of layers of data representing a distinct variable of the virtual environment being modeled and including a plurality of cells, each cell containing a first datum and a second datum, the first datum corresponding to a different variable than the second datum, the plurality of cells in the first layer corresponding to a plurality of cells in the second layer;
b. connecting layers among the plurality of layers of data using one or more pipes, each of the one or more pipes being configured for mapping a group of one or more cells in the source layer to a group of one or more cells in the target layer on a one-to-one basis so that cell data is propagated between the source layer and target layer;
c. operating on at least one of the data from the cells in the first layer with a function to yield respective target data, the operating including processing the at least one of the one or more pipes;
d. basing a calculation at least partially on the target data, the calculation performed on a respective datum in a corresponding cell in the second layer; and
e. altering at least one of the data in at least one of the plurality of cells in each layer according to a rule, wherein the altering includes: i. dividing at least one layer of the plurality into a plurality of overlapping sublayers, wherein certain cells are duplicated in more than one sublayer;
  ii. sending the data from each sublayer to separate slave processes along with the rule;
  iii. receiving the altered data from each sublayer back from the slave processes; and
  iv. combining the sublayers and discarding duplicate data to create one layer containing altered data.

* * * * *